United States Patent
Shavit et al.

(10) Patent No.: US 9,111,971 B2
(45) Date of Patent: Aug. 18, 2015

(54) SYSTEM AND METHOD FOR TEMPERATURE CONTROL OF A SEMICONDUCTOR WAFER

(75) Inventors: Lavy Shavit, Jerusalem (IL); Rafi Kraus, Holon (IL); Itzak Yair, Ramat Ishai (IL); Samuel Nackash, Nes-Ziona (IL); Yuri Belenky, Rishon Lezion (IL)

(73) Assignee: APPLIED MATERIALS ISRAEL, LTD., Rehovot (IL)

( * ) Notice: Subject to any disclaimer, the term of this patent is extended or adjusted under 35 U.S.C. 154(b) by 331 days.

(21) Appl. No.: 13/562,238

(22) Filed: Jul. 30, 2012

(65) Prior Publication Data

US 2014/0027437 A1   Jan. 30, 2014

(51) Int. Cl.
*H01L 21/67* (2006.01)
*F27D 13/00* (2006.01)
*F27B 5/18* (2006.01)
*F27B 17/00* (2006.01)

(52) U.S. Cl.
CPC .......... *H01L 21/67248* (2013.01); *F27D 13/00* (2013.01); *H01L 21/67098* (2013.01); *H01L 21/67103* (2013.01); *H01L 21/67115* (2013.01); *F27B 5/18* (2013.01); *F27B 17/0025* (2013.01)

(58) Field of Classification Search
None
See application file for complete search history.

(56) References Cited

U.S. PATENT DOCUMENTS

| | | | |
|---|---|---|---|
| 6,688,375 B1 * | 2/2004 | Turner et al. | 165/48.1 |
| 6,860,965 B1 * | 3/2005 | Stevens | 156/345.32 |
| 7,960,297 B1 * | 6/2011 | Rivkin et al. | 438/800 |
| 8,052,419 B1 * | 11/2011 | Nordin et al. | 432/247 |
| 8,273,670 B1 * | 9/2012 | Rivkin et al. | 438/800 |
| 2001/0052392 A1 * | 12/2001 | Nakamura et al. | 156/345 |
| 2002/0008099 A1 * | 1/2002 | Davis et al. | 219/390 |
| 2004/0020601 A1 * | 2/2004 | Zhao et al. | 156/345.32 |
| 2004/0152315 A1 * | 8/2004 | Oh | 438/689 |
| 2005/0115946 A1 * | 6/2005 | Shim et al. | 219/390 |
| 2010/0040437 A1 * | 2/2010 | Iwabuchi | 414/217 |
| 2010/0279516 A1 * | 11/2010 | Chen et al. | 438/795 |

* cited by examiner

*Primary Examiner* — Joseph M Pelham
(74) *Attorney, Agent, or Firm* — Kilpatrick Townsend & Stockton LLP

(57) ABSTRACT

A semiconductor wafer is received at a first chamber that is at a first pressure level. The semiconductor wafer is at a first temperature and is heated, by a first heating module, to a second temperature while the pressure level of the first chamber is reduced from the first pressure level to a second pressure level. The semiconductor wafer is then provided to a supporting element of a second chamber which maintains a third pressure level that is closer to the second pressure level than to the first pressure level; the supporting element being at a third temperature that is closer to the second temperature than to the first temperature.

14 Claims, 11 Drawing Sheets

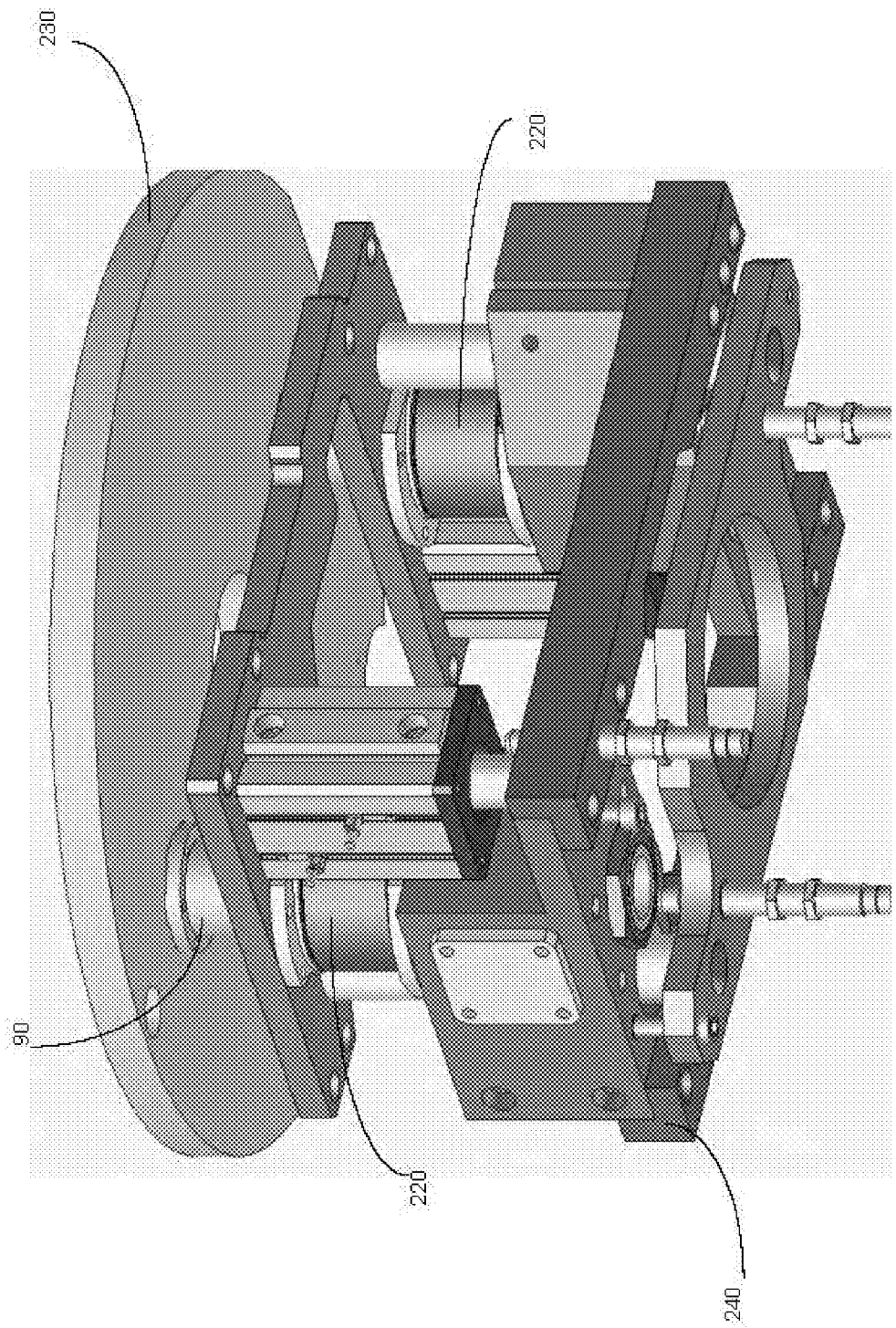

SYSTEM AND METHOD FOR TEMPERATURE CONTROL OF A SEMICONDUCTOR WAFER

FIELD OF THE INVENTION

The present invention relates to systems and methods for temperature control of a semiconductor wafer, for example such systems and methods that assist in reducing thermal expansion of the semiconductor wafer.

BACKGROUND

Semiconductor wafers can be transferred from one tool to another while being exposed to ambient temperature and ambient pressure levels. A tool can process or inspect the semiconductor wafer within a chamber that can maintain temperature and pressure levels that differ from the ambient temperature and ambient pressure level.

The semiconductor wafer is usually positioned on a chuck when it is processed or inspected. The temperature of the chuck is higher than the ambient temperature and when the semiconductor wafer is placed on the chuck it experiences a thermal expansion.

This thermal expansion increases the uncertainty level associated with any processing or inspection process, and may reduce the speed and accuracy of such inspection or processes. During inspection a larger area of the semiconductor wafer can be scanned in order to account for the thermal expansion.

Furthermore, when an inspection tool is required to provide class images with the defect centered within 10% of the image size, the thermal expansion between defect detection and the class image grab increases the uncertainty of defect center.

A thermal expansion that exists during image grab may also cause miss-registration of frames which is equivalent to enlarging the spot. This effect depends on the expansion slope and is more severe at the wafer edge, shortly after the semiconductor wafer has been loaded.

SUMMARY

The present inventors have determined there is a need for systems and methods for reducing the thermal expansion of a semiconductor wafer. According to an embodiment of the invention there is provided a method that may include receiving a semiconductor wafer at a first chamber when the first chamber is at a first pressure level and the semiconductor wafer is at a first temperature; heating the semiconductor wafer, by a first heating module, to a second temperature and reducing the pressure level of the first chamber to a second pressure level; and providing the semiconductor wafer to a supporting element of a second chamber when the second chamber maintains a third pressure level; wherein the supporting element is at a third temperature that is closer to the second temperature than to the first temperature, and the third pressure level is closer to the second pressure level than to the first pressure level.

According to an embodiment of the invention, a system may be provided and may be capable of executing the method and any combination of stages of the method. The system may include a first chamber arranged to receive a semiconductor wafer when the first chamber is at a first pressure level and the semiconductor wafer is at a first temperature; wherein the first chamber is arranged to reduce the pressure level of the first chamber to a second pressure level; a first heating module, arranged to heat the semiconductor wafer to a second temperature; a second chamber arranged to receive the semiconductor wafer and place the semiconductor wafer on a supporting element while maintaining a third pressure level; wherein the supporting element is at a third temperature that is closer to the second temperature than to the first temperature, and wherein the third pressure level is closer to the second pressure level than to the first pressure level.

The system may include a first chamber arranged to receive, from a first transfer unit, the semiconductor wafer when the first chamber is at the first pressure level and the semiconductor wafer is at the first temperature, wherein the first chamber comprises a first pressure control unit that is arranged to reduce the pressure level of the first chamber to a second pressure level; a first heating module that comprises at least one heating element that is controlled by a heating controller that is fed by temperature readings of at least one temperature sensor, wherein the at least one heating element is arranged to heat the semiconductor wafer to a second temperature; a second transfer unit arranged to transfer the semiconductor wafer between the first chamber and a second chamber of the system, wherein the second chamber comprises a supporting element that is arranged to receive the semiconductor wafer while a second pressure control unit maintains a third pressure level and while the supporting element is at a third temperature that is closer to the second temperature than to the first temperature, and wherein the third pressure level is closer to the second pressure level then to the first pressure level.

The second and third temperatures may be substantially equal to each other. Further, the second and third pressure levels may substantially equal to each other. The first chamber may be a load lock and the second pressure level may be a vacuum pressure level.

The method may include contacting a backside of the semiconductor wafer by the first heating module and heating the semiconductor wafer by the first heating module while contacting the semiconductor wafer.

The method may include heating an upper side of the semiconductor wafer by a second heating module.

The method may include heating the semiconductor wafer by the second heating module while the second heating module does not contact the semiconductor wafer.

The method may include lifting, by a lifting module coupled to the first heating module, the semiconductor wafer from another element of the first chamber, and heating the semiconductor by the first heating module.

The other element may be a pre-aligner and the first heating module may have a central aperture that surrounds the pre-aligner.

The method may include starting the heating of the semiconductor wafer before starting the reducing of the pressure level of the first chamber.

The method may include heating the semiconductor wafer by a heating element of the first heating module, wherein the heating element is positioned within a heat conducting housing and is maintained at a pressure level that exceeds the second pressure level.

The method may include determining a manner of heating the semiconductor wafer in response to an outcome of at least one sensing attempt of at least one temperature of an ambient temperature and a temperature of the supporting element of the second chamber.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read in conjunction with the accompanying drawings, in which:

FIGS. 4A and 4B illustrate various portions of a system according to an embodiment of the invention.

Figure 1:
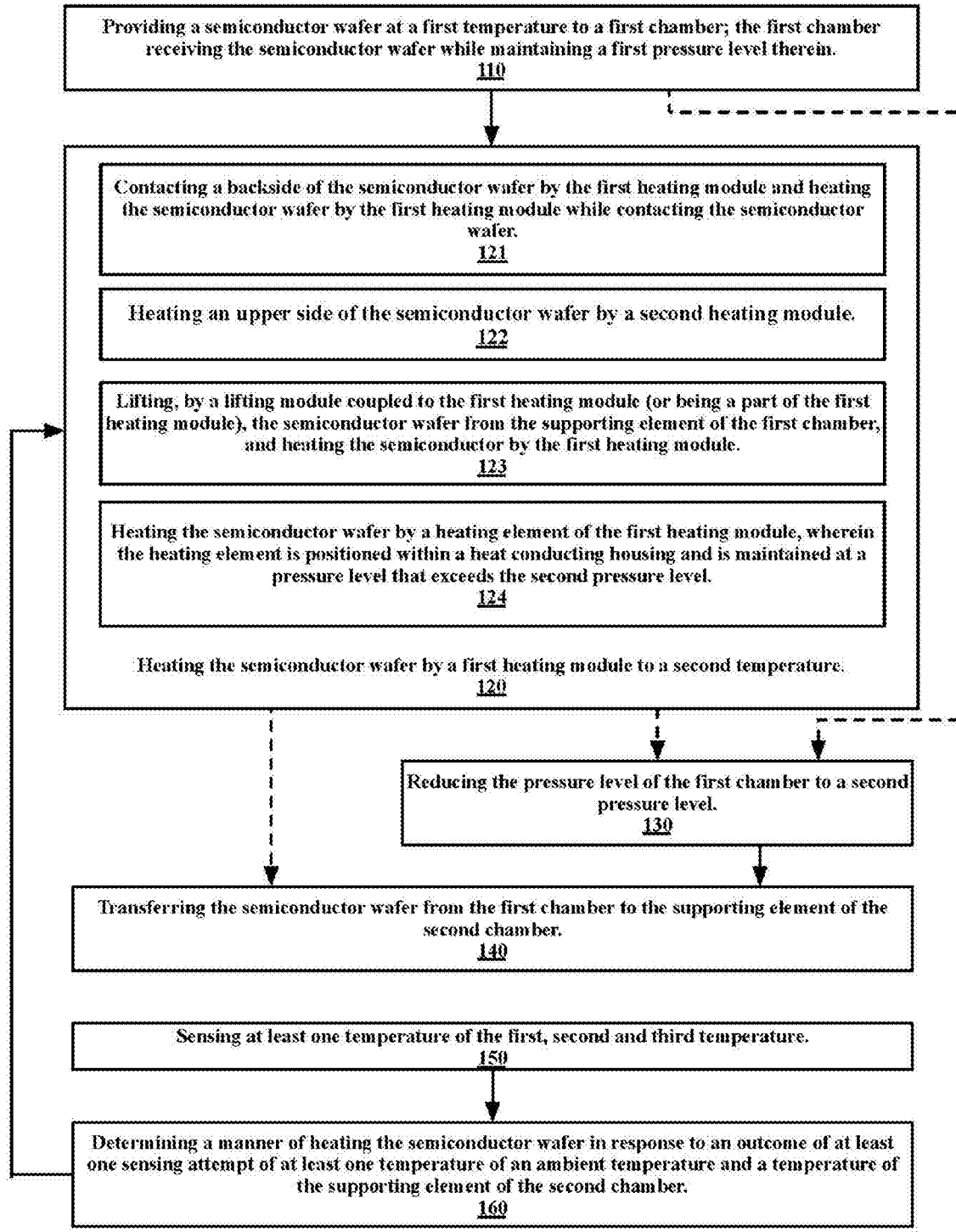
FIG. 1 illustrates a method according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Because the illustrated embodiments of the present invention may, for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

FIG. 1 illustrates method 100 according to an embodiment of the invention.

Method 100 may start by stage 110 of providing a semiconductor wafer to a first chamber. The semiconductor wafer can be at a first temperature that can be an ambient temperature. The first temperature can be a temperature of a cassette that holds the semiconductor wafer. The semiconductor wafer can be taken from the cassette by a first robot and provided to a pre-aligner or other supporting element to the first chamber. The supporting element is arranged to support the semiconductor wafer and may also move it.

Stage 110 may include receiving by the first chamber the semiconductor wafer while a first pressure level is maintained in the first chamber. This first pressure level can be an atmospheric pressure level.

Stage 110 may be followed by stages 120 and 130. These stages can be executed in parallel, in an overlapping manner, in a partially overlapping manner or in a non-overlapping manner. These stages can start at the same time or at different times, and may end at the same time or at different times.

Stage 120 may include heating the semiconductor wafer by a first heating module to a second temperature. The heating process may include maintaining the temperature of the semiconductor wafer until it is provided to a second chamber.

According to an embodiment of the invention the second temperature can be higher that the third temperature. This can assist in at least partially compensating for a possible reduction in the temperature of the semiconductor wafer during the transfer from the first chamber to the second chamber. The reduction of the temperature can also be attributed to a change in the manner in which the semiconductor wafer is heated—a change that can be introduced before or during the transfer. Such a change can occur, for example, if the semiconductor wafer is heated when being contacted by a first heating module and if the contact stops before the transfer of the semiconductor wafer to the second chamber.

Due to heat transfer considerations it can be beneficial to start heating the semiconductor wafer before the pressure level reaches the second pressure level, but this is not necessarily so.

The semiconductor wafer is transferred to the second chamber while the second chamber maintains a third pressure level and the supporting element of the second chamber is at a third temperature.

The third temperature is closer to the second temperature than to the first temperature. The third pressure level is closer to the second pressure level than to the first pressure level.

The second and third temperatures can be substantially equal to each other. The second and third pressure levels can be substantially equal to each other. The first chamber can be a load lock. The second and third pressure levels can be vacuum pressure levels.

It is noted that the terms first, second and third temperatures are used to differentiate between these temperatures. The values of the first, second and third temperature can change over time. For example, the ambient temperature can change and the temperature of the supporting element of the second chamber can change due to heating resulting from movement of the supporting element or movement of its components.

Stage 120 can include at least one of stages 121, 122, 123 and 124, all discussed below.

Stage 121 may include contacting a backside of the semiconductor wafer by the first heating module and heating the semiconductor wafer by the first heating module while contacting the semiconductor wafer.

The heating can start before the contact or after the contact, and can stop during the contact, after the contact ends or when the contact ends once the semiconductor wafer and the first heating element are spaced apart from each other. The contact can be achieved by moving the first heating module towards the semiconductor wafer, by moving the semiconductor wafer towards the first heating module or both.

Stage 122 may include heating an upper side of the semiconductor wafer by a second heating module. This can be done in a contactless manner, for example wherein the heating is done by radiating heat.

Additionally or alternatively, the second heating module can contact at least a portion of the semiconductor wafer. The contact can be made at an edge of the semiconductor wafer, at scribe lines and the like. It may be moiré beneficial to contact only the backside due to contamination issues.

Stage 123 may include lifting, by a lifting module coupled to the first heating module (or being a part of the first heating module), the semiconductor wafer from the supporting element of the first chamber, and heating the semiconductor by the first heating module.

The supporting element of the first chamber can be a pre-aligner and the first heating module can have a central aperture that surrounds the pre-aligner so that a vertical movement of the semiconductor wafer is enough to detach the semiconductor wafer from the pre-aligner and be positioned above the pre-aligner such as to contact the first heating module.

It is noted that the first heating element can have an annular shape or can include multiple spaced apart segments that may contact the semiconductor wafer and lift it over the pre-aligner.

The first chamber can reduce the pressure level of the second pressure level and the first heating module can include one or more heating elements that are not compatible with the second pressure level. For example, the one or more heating elements of the first heating module can be inadequate for working in a second pressure level that is vacuum. This may simplify and reduce the cost of these one or more heating elements. These one or more heating elements can be located in a housing that is heat conducting (or has at least one heat conducting portion) that maintains the pressure within the first heating module while conducting heat towards the semiconductor wafer.

Accordingly, stage 120 can include stage 124 of heating the semiconductor wafer by a heating element of the first heating module, wherein the heating element is positioned within a heat conducting housing and is maintained at a pressure level that exceeds the second pressure level.

Stage 130 may include reducing the pressure level of the first chamber to a second pressure level. The second pressure level can be a vacuum level. It can be equal or substantially equal to a third pressure level maintained by a second chamber in which the semiconductor wafer is inspected or processed.

The use of dashed lines in FIG. 1 is intended to indicate that reduction of the pressure level at stage 130 can start before stage 120 starts, can start in parallel with the initialization of stage 120 and/or can start after stage 120 starts. The second pressure level may be maintained after the semiconductor wafer is provided to the second chamber, after receiving back the semiconductor wafer and sealing an opening between the first and second chambers.

Stages 120 and 130 can be followed by stage 140 of transferring the semiconductor wafer from the first chamber to the supporting element of the second chamber. This can be done by a second robot or other transferring modules. The supporting element of the second chamber can be a chuck.

Stage 140 can include (or be preceded by) lowering the semiconductor from a lifted position and placing it on the supporting element of the first chamber. Alternatively, the semiconductor wafer can be taken while being supported by the first heating module.

The heating process can be responsive to the temperature of the semiconductor wafer before it enters the first chamber (for example, to an ambient temperature or to a temperature of a wafer holding cassette), and additionally, or alternatively, to the temperature of the supporting element of the second chamber (e.g., a third temperature). The heating process aims to reduce the gap between these temperatures and when the gap is smaller a less aggressive heating process can be applied.

This is illustrated by stage 150 of sensing at least one temperature of the first, second and third temperature and stage 160 of determining a manner of heating the semiconductor wafer in response to an outcome of at least one sensing attempt of at least one temperature of an ambient temperature and a temperature of the supporting element of the second chamber. Stage 160 is illustrated as being followed by stage 120.

FIGS. 2A-2E illustrates a system 200 that executes various stages in a semiconductor wafer inspection process according to various embodiments of the invention.

Figure 2A:
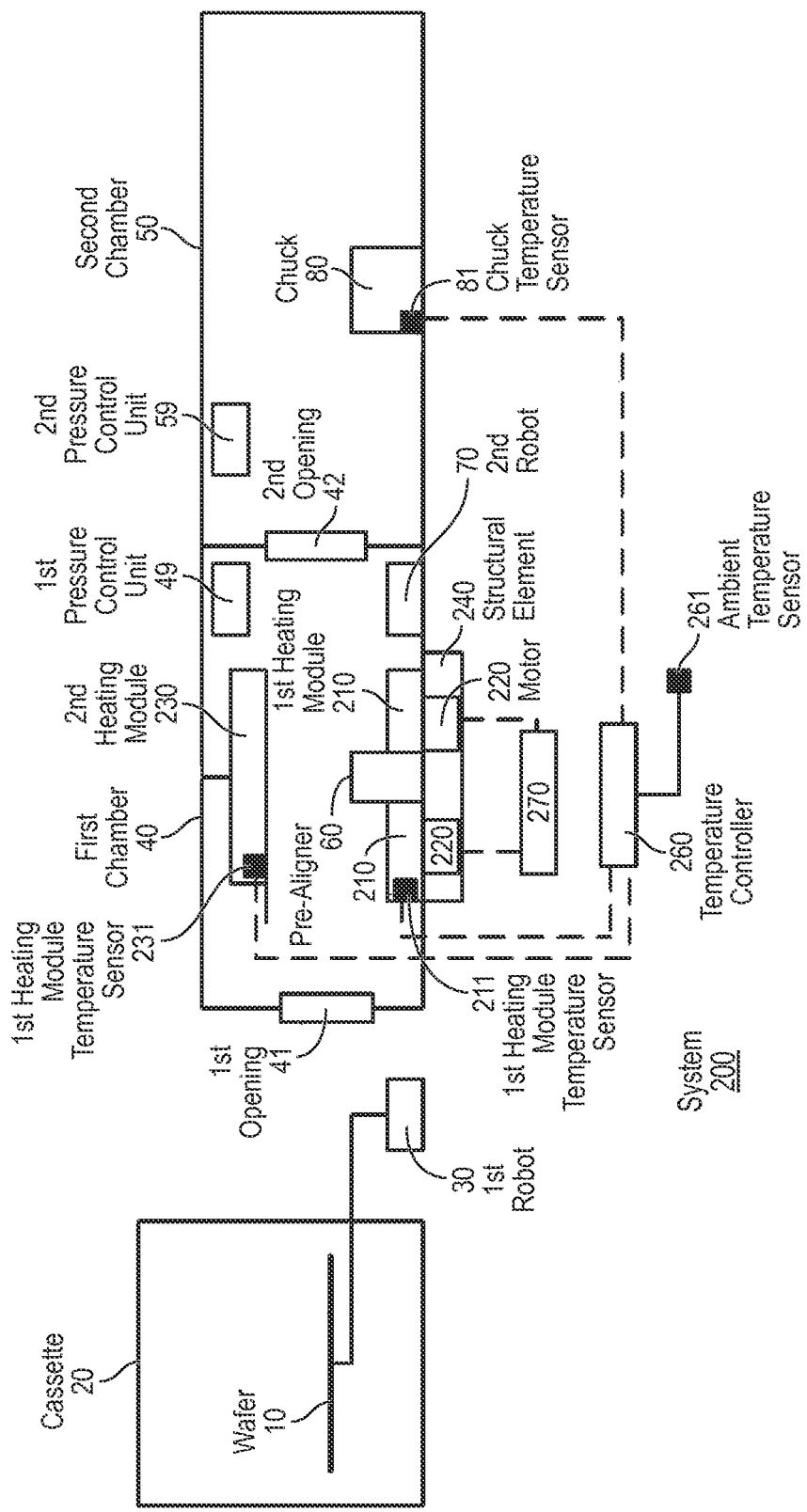
FIGS. 2A-2E illustrate a system that executes various stages in a semiconductor wafer inspection process according to various embodiments of the invention.

FIG. 2A illustrates the system 200 when the semiconductor wafer 10 is located at cassette 20 and is contacted by a first transfer unit such as first robot 30.

Figure 2B:
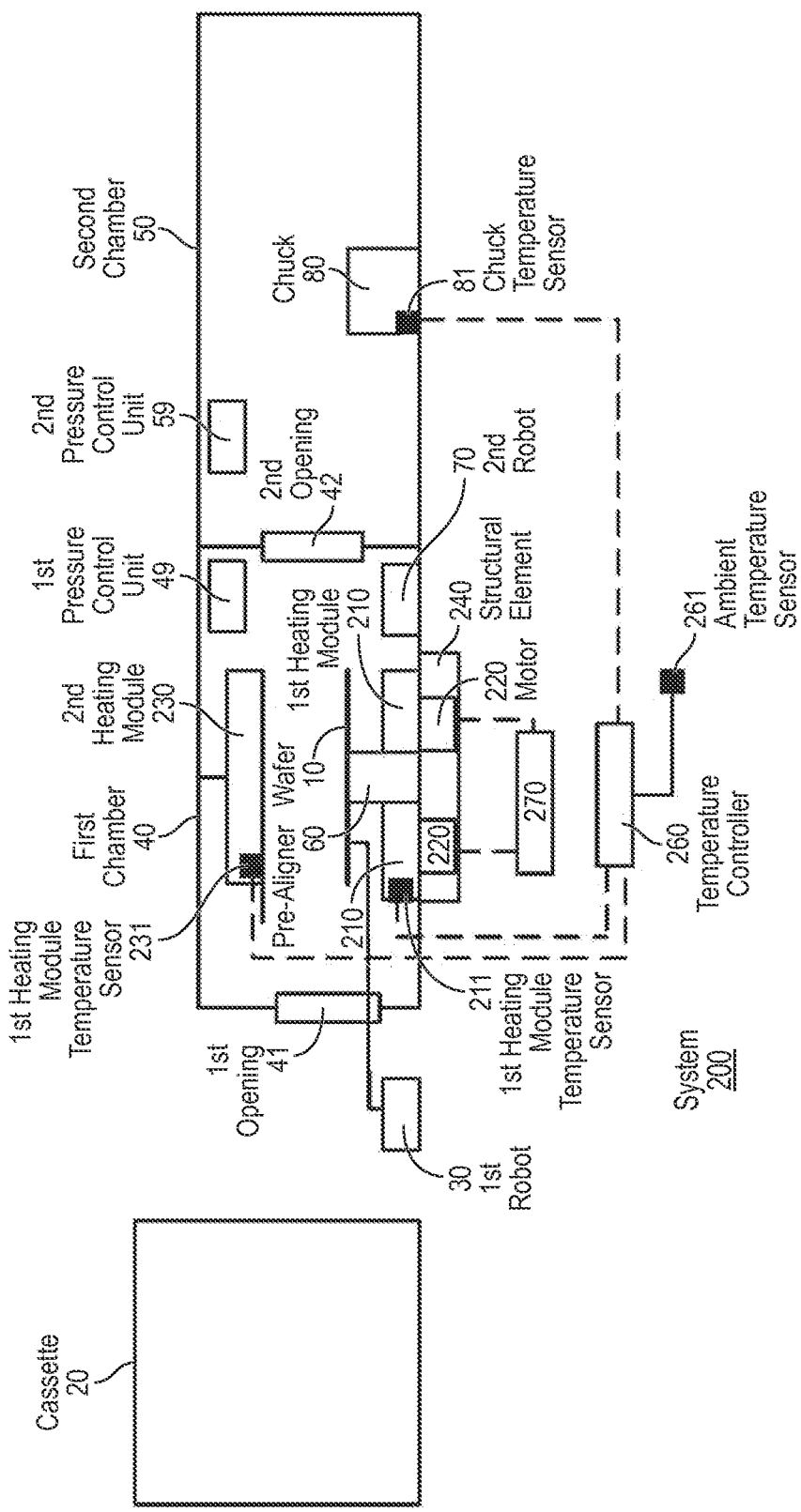

FIG. 2B illustrates the system 200 when the semiconductor wafer 10 is positioned on top of a supporting unit such as pre-aligner 60 of first chamber 40. First robot 30 has completed a transfer of the semiconductor wafer 10 from the cassette to the first chamber 40.

Figure 2C:
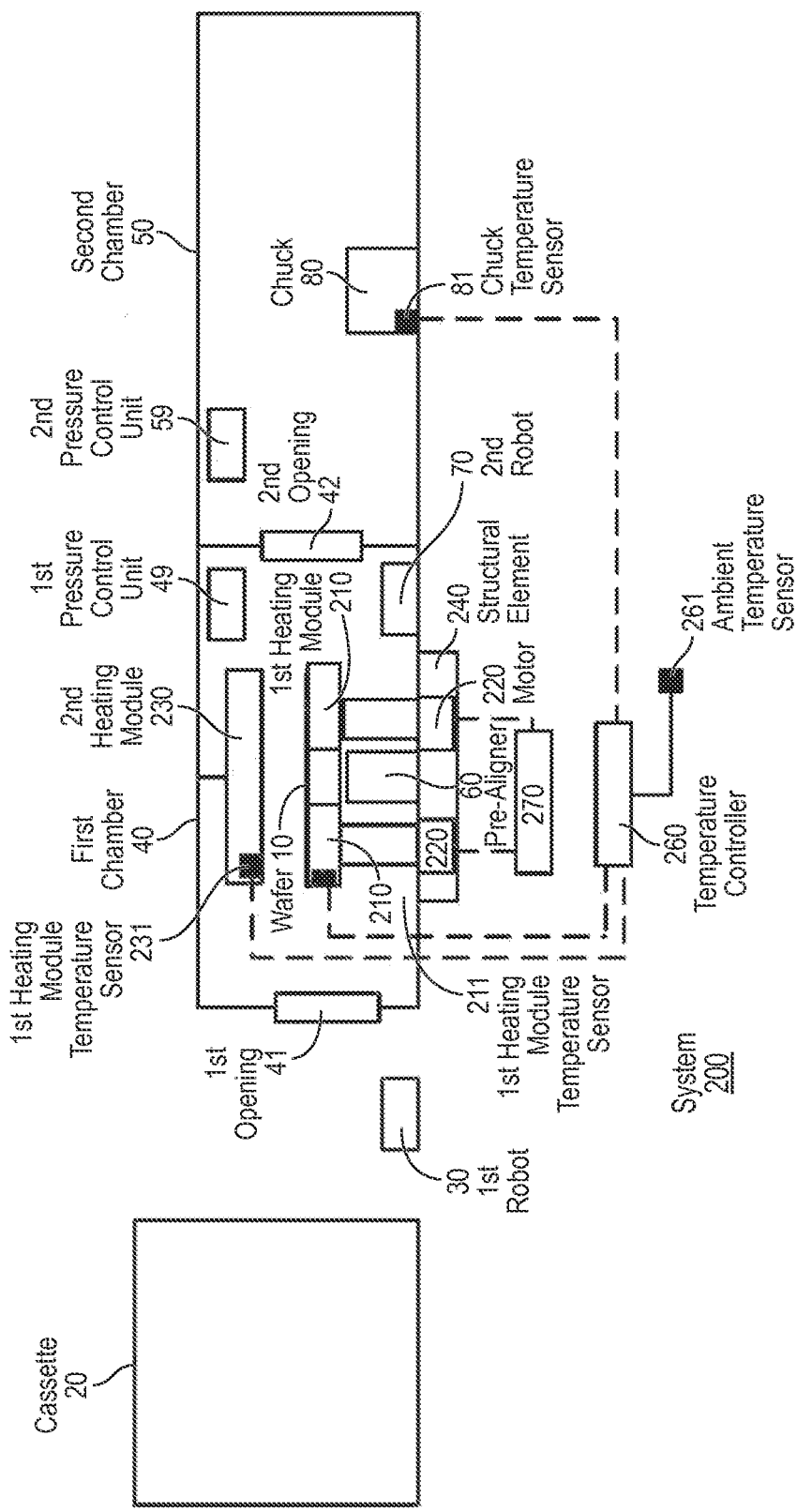

FIG. 2C illustrates the system 200 when the semiconductor wafer 10 is positioned on top of a first heating module 210 that lifted the semiconductor wafer 10 above the pre-aligner 60.

Figure 2D:
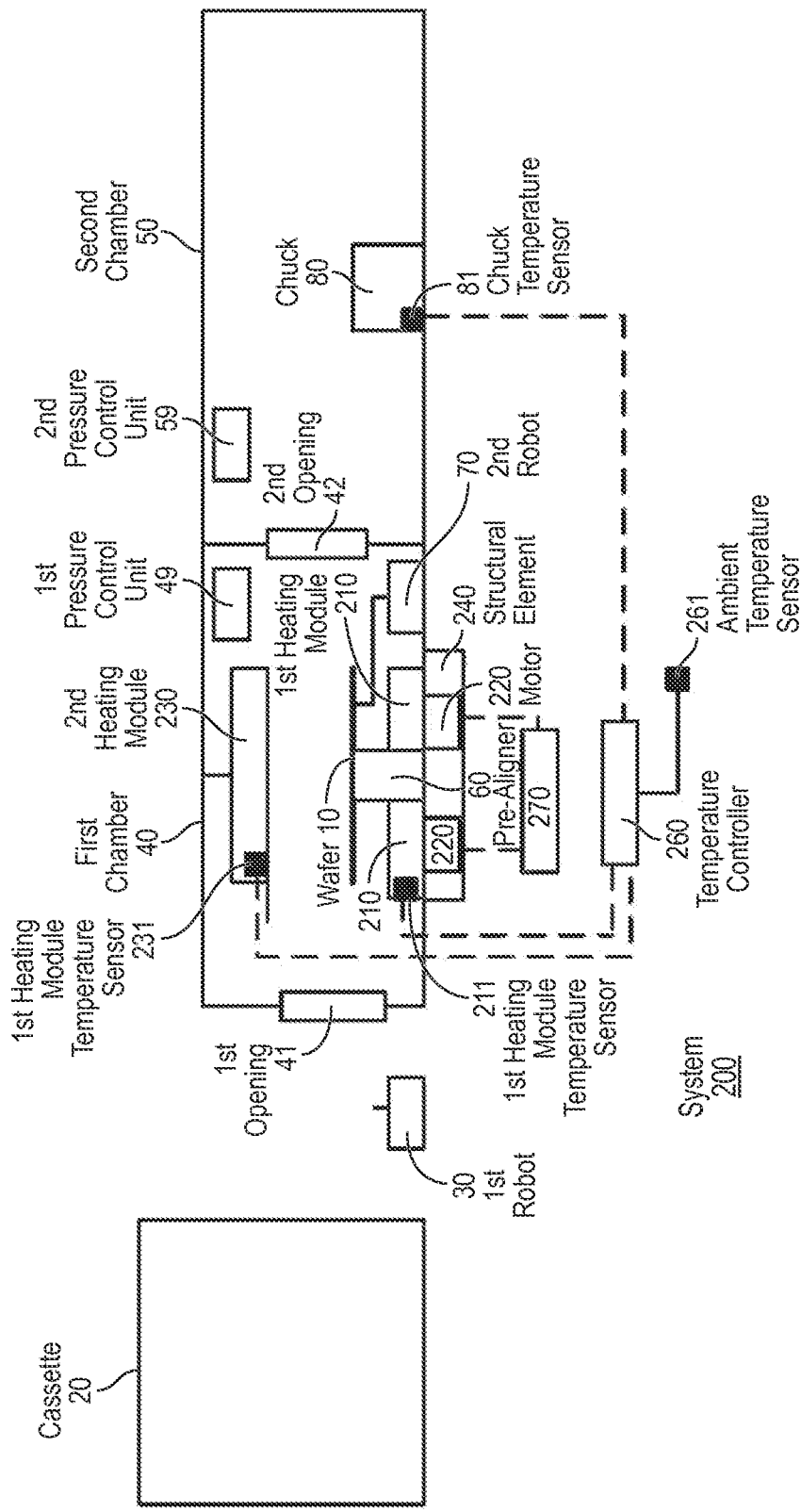

FIG. 2D illustrates the system 200 when the semiconductor wafer 10 is positioned on top of a pre-aligner 60 and after the first heating module 210 was lowered and the semiconductor wafer 10 is supported by the pre-aligner 60. Also shown is a second transfer unit, such as second robot 70, contacting the semiconductor wafer 10.

Figure 2E:
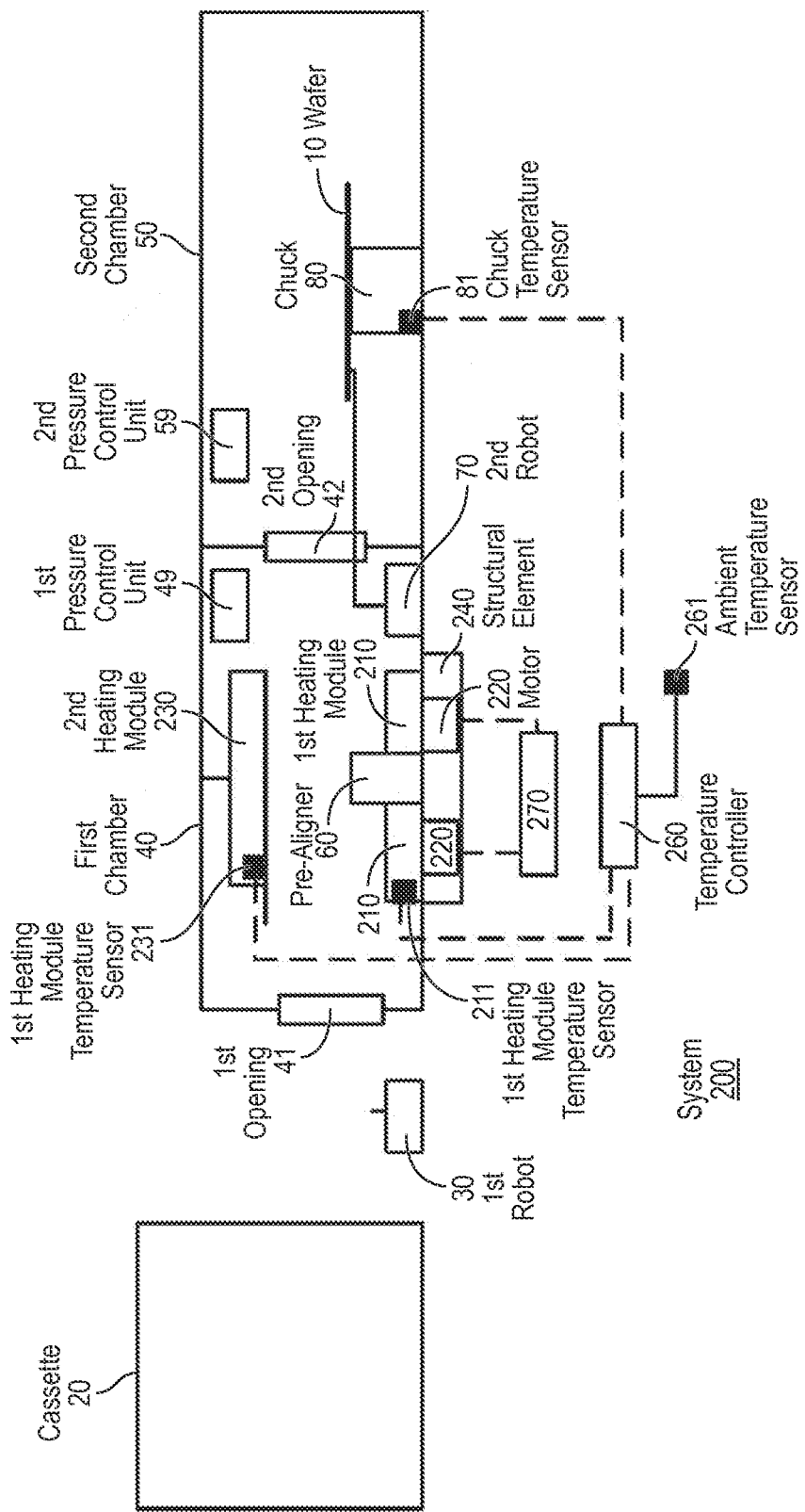

FIG. 2E illustrates the system 200 when the semiconductor wafer 10 is positioned on top of a supporting unit, such as chuck 80, of a second chamber 50. The second robot 70 is shown as completing the transfer of the semiconductor wafer 10 from the first to the second chamber.

Once the processing or inspection is completed at least some of the stages illustrated in FIGS. 2A-2E are reversed. For example, first and second robots 30 and 70 can transfer the semiconductor wafer from the second chamber 50 to the first chamber 40 and from the first chamber 40 to the cassette.

The first heating module 210 may be arranged to heat the semiconductor wafer to a second temperature.

The second chamber 50 may be arranged to receive the semiconductor wafer 10 and place the semiconductor wafer 10 on a supporting element such as a chuck 80 while maintaining a third pressure level.

The chuck 80 can be at a third temperature when it receives the semiconductor wafer, slightly before it receives the semiconductor wafer, immediately after receiving the semiconductor wafer or at any point in time proximate to the reception of the semiconductor wafer.

The third temperature may be closer to the second temperature than to the first temperature and the third pressure level may be closer to the second pressure level then to the first pressure level.

The second and third temperatures can be substantially equal to each other and the second and third pressure levels may be substantially equal to each other, Accordingly, the first chamber 40 can be arranged to reduce the difference between the ambient conditions and the conditions that exist in the second chamber 50.

The first chamber 40 can perform at least one additional function such as aligning the semiconductor wafer to a desired location and/or orientation, reading information imprinted on the semiconductor wafer and indicative of at least one property of the semiconductor wafer, and the like. The alignment can occur before the heating, before the lifting, after the heating or after the lowering of the semiconductor wafer. The lifting of the semiconductor wafer may be designed not to rotate or move the semiconductor wafer in a manner that will cause it to be misaligned. Thus, the movement of the semiconductor wafer can be limited to vertical movement only.

The semiconductor wafer can be heated by at least one heating module. Zero or more heating modules can contact the semiconductor wafer. Zero or more heating modules can heat the semiconductor wafer without contacting it.

A heating module can start heating the semiconductor wafer before contacting the semiconductor wafer, only during the contacting of the semiconductor wafer, or can stop the heating of the semiconductor wafer after it ceases to stop contacting the semiconductor wafer.

Each heating module can be controlled independently from other heating modules but there can exist a dependency between the heating applied between different heating modules.

One or more heating modules 210 and 230 can apply the same heating parameters during one or more heating iterations but one or more heating parameters can vary over time. Heating parameters can include a goal temperature, an amount of power or current consumed during the heating and the like. The heating can be applied in a continuous or non-continuous manner. The heating parameters can be set by the heating controller 260.

The first chamber 40 may be a load lock. The first chamber 40 may include a first opening 41, a second opening 42, a first supporting element such as a pre-aligner 60, a first heating module 231, and a second heating module 230. Any of the above-mentioned systems may include first and second transfer units such as first and second robots 30 and 70, structural element 240, cylinders (such cylinders 90 of FIG. 2C) and motors 220 that may be fixed to the first chamber 40 by the structural elements 240.

The second chamber 50 can be an inspection chamber, a manufacturing process chamber and the like.

The first chamber 40 also includes a first pressure control unit 49 that is arranged to reduce the pressure level of the first chamber to a second pressure level. The second chamber 50 may include a second pressure control unit 59 that is arranged to reduce the pressure level of the first chamber to a second pressure level. Either one of these pressure control units can include a pump (such as a vacuum pump), a pressure level sensor (not shown), pipes, sealing element and the like.

Both chambers 40 and 50 may share one or more openings such as opening 42 that may selectively open (and allow a transfer of semiconductor wafer 10 therethrough) once predefined conditions are fulfilled—for example when pressure level equalization is achieved and the inspection or manufacturing process may begin.

FIGS. 2A-2E also illustrates various temperature sensors: first heating module temperature sensor 211, second heating module temperature sensor 231, chuck temperature sensor 81 and ambient temperature sensor 281. These temperature sensors are connected to temperature controller 260. Temperature controller 260 may control the heating process based upon readings of one or more of these temperature sensors. For example, lower gaps between the ambient temperatures and the temperature of the chuck can result in a more moderate heating process.

Figure 3A:
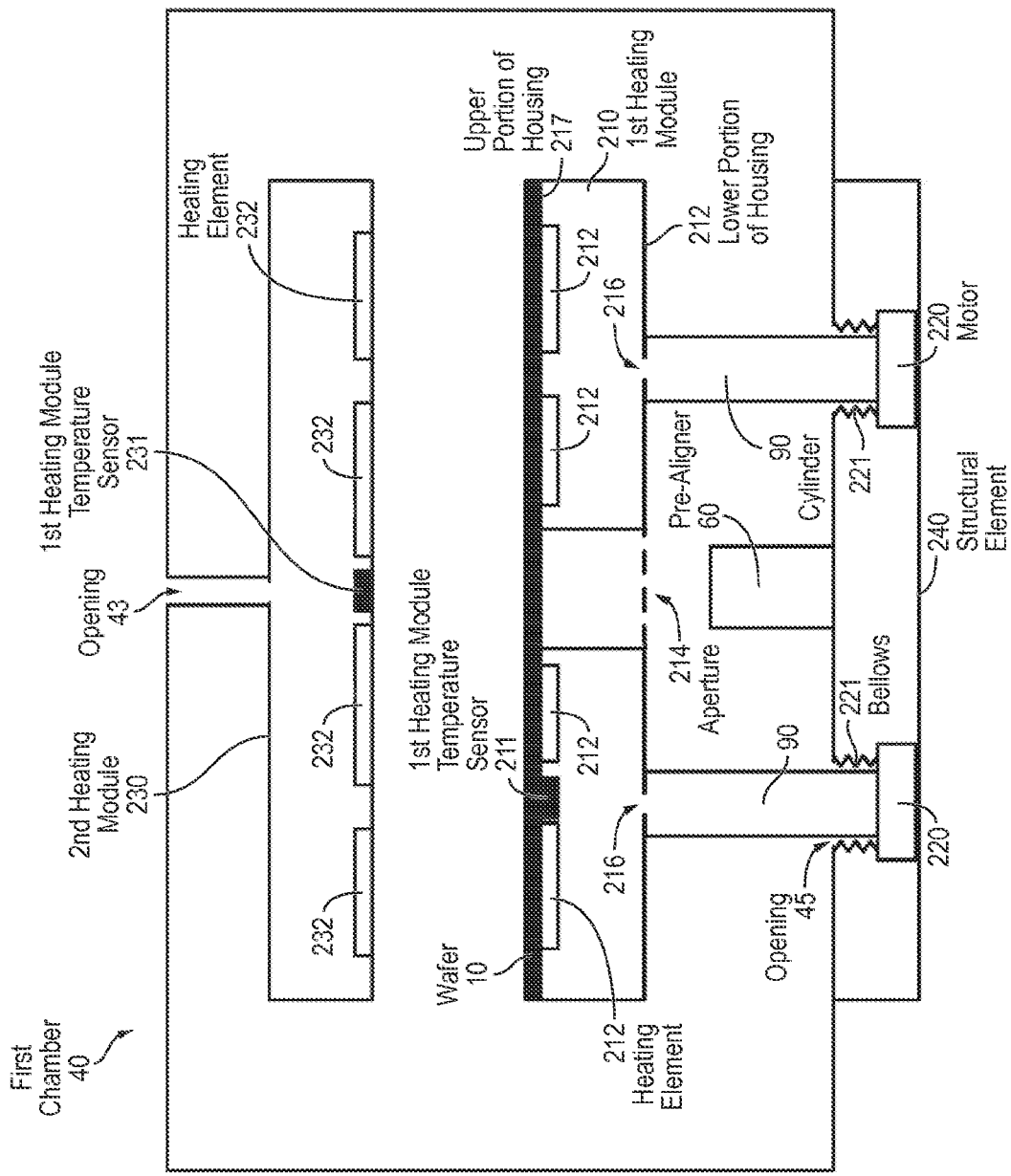
FIGS. 3A-3B illustrate a first chamber and a semiconductor wafer according to various embodiments of the invention.
Figure 3B:
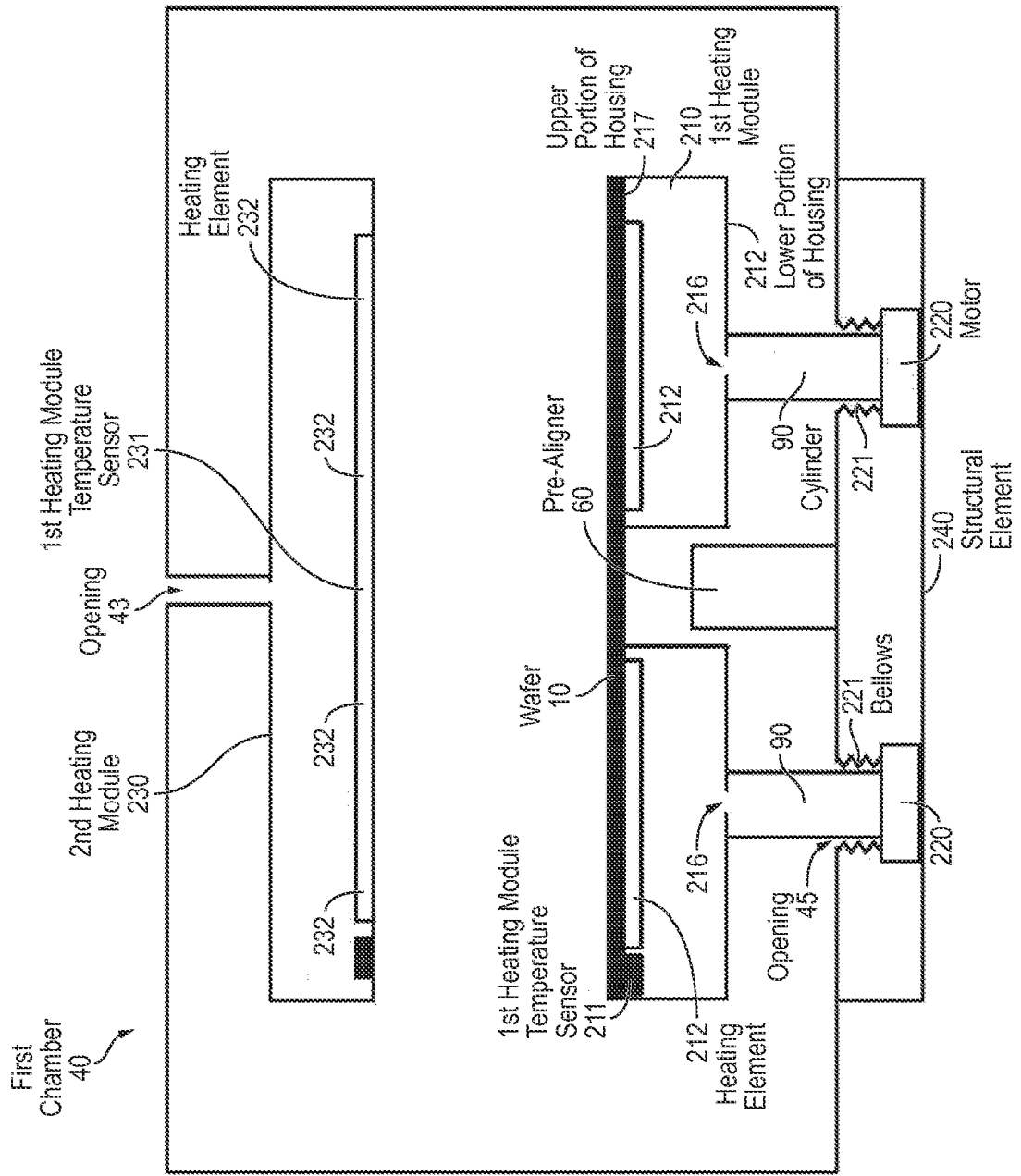
Figure 4A:
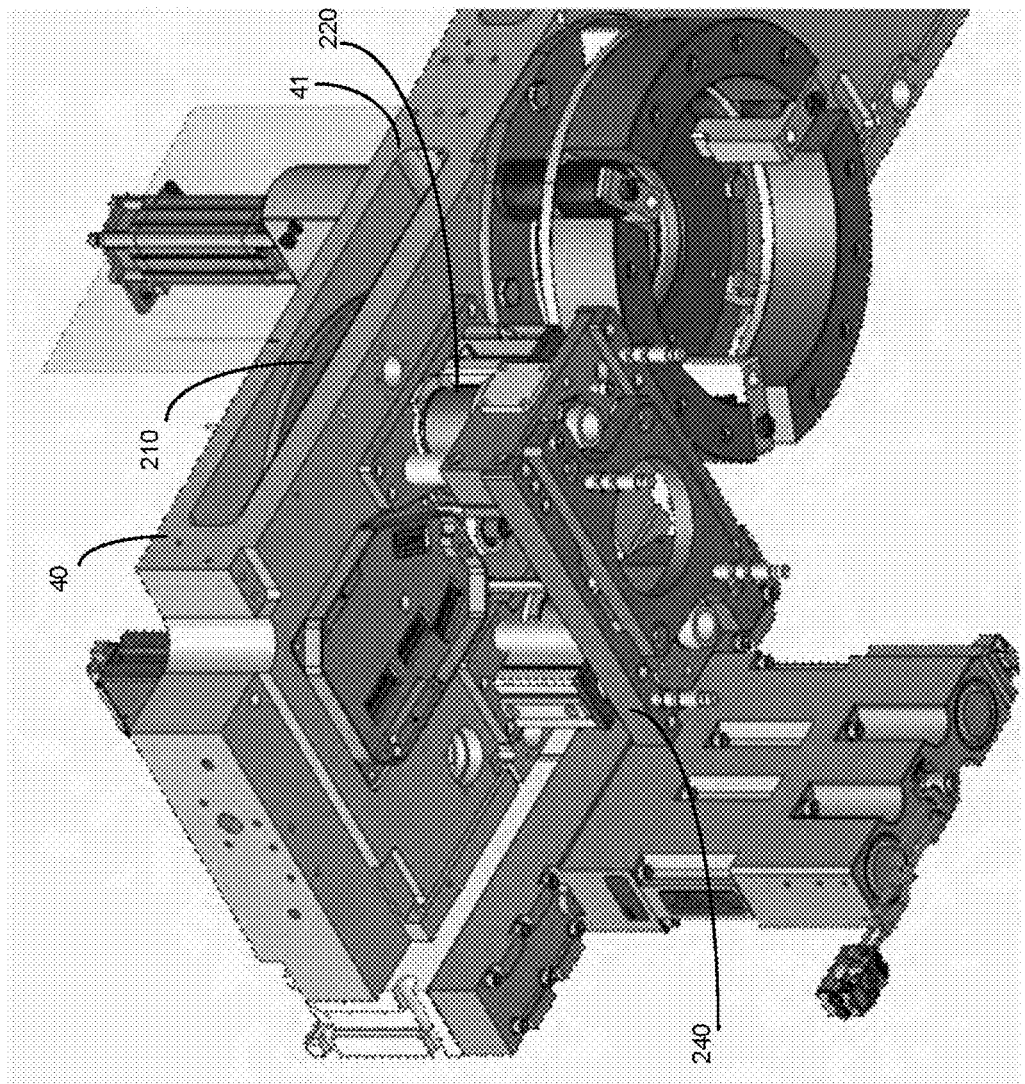

An indicated above, the semiconductor wafer 10 can be elevated above the pre-aligner 60 in order to ensure contact between the semiconductor chuck 10 and the first heating module 210. The lower portion of the first heating module 210 can be higher than the top of the pre-aligner 60 (as illustrated in FIGS. 2C and 3A) or below that top (as illustrated in FIG. 3B).

The second heating module 230 can be positioned above the semiconductor wafer 10 and can heat it by contact or in a contactless manner by radiation alone.

The first and second heating modules 210 and 230 can heat the semiconductor wafer 10 simultaneously, in a partially overlapping manner or in a non-overlapping manner. For example, the second heating module 230 can heat the semiconductor wafer 10 before the semiconductor wafer is elevated and, additionally or alternatively, after it is lowered, while the first heating module 210 can heat the semiconductor wafer 10 at the same time or during other periods.

The second chamber 50 can maintain vacuum while the semiconductor wafer is being processed, inspected, measured (metrology) and the like.

The first chamber 40 is arranged to receive the semiconductor wafer when the first chamber 40 is at a first pressure level and the semiconductor wafer is at a first temperature. The first chamber 40 is arranged to reduce the pressure level of the first chamber to a second pressure level. The first pressure level can be an atmospheric (ambient) pressure level. The first chamber 40 can attempt to perform pressure equalization with the second chamber 40 before providing the semiconductor wafer to the second chamber 50.

FIGS. 3A-3B illustrate a first chamber 40 and a semiconductor wafer 10 according to various embodiments of the invention.

FIGS. 3A and 3B illustrate a lifting module that includes cylinders 90 and lifting elements such as motors 220 that may lift the first heating module 210 so that the first heating module 210 is lifted from a lower position in which is below the top of the pre-aligner 60 to a upper position where the first heating module contacts the semiconductor wafer 10 and lifts it above the top of the pre-aligner 60. The first heating module 210 can have an aperture 214 that surrounds the pre-aligner 60 and allows the vertical movement of the first heating module from the lower position to the upper position.

According to an embodiment of the invention at least one of the first and second heating modules 210 and 230 includes heating elements that are not compatible with the second pressure level, for example these one or more heating elements may be not compatible with vacuum environments. Nevertheless, these one or more heating elements can be enclosed in a housing that can transfer heat but maintain a pressure difference between the space within the housing and the exterior of the housing.

Thus, the housing can maintain an atmospheric pressure level while the first chamber 50 can maintain a vacuum pressure level. These pressure differences may reduce the cost of the heating elements and can assist in detecting leaks of the housing as such leaks will cause changes in the pressure level of the first chamber which can be easy to detect and speed the repair process of such leaks. FIG. 3A illustrates that the housing of the first heating module 210 includes a lower part 218 and an upper part.

The number of heating elements and their shape and size may differ from one embodiment of the invention to the other. One or more heating elements of the first heating module can cover the entire backside of the semiconductor wafer around the aperture of the first heating module 210 but this is not necessarily so.

FIGS. 3A and 3B differ from each other by the number and size of heating elements 212 of the first heating module and the number and size of the heating elements of the second heating module 230.

Both FIGS. 3A and 3B illustrate opening 43 in the first chamber 40 that may allow the passage of control wires, power wires and temperature reading wires to heating elements 232 and temperature sensor 231. These figures also illustrate openings 45 formed in the first chamber 40 for allowing pistons 90 control wires, power wires and temperature reading wires and to pass therethrough. The motors 220 can be maintained in atmospheric pressure and can be isolated from the interior of the first chamber 40 by flexible bellows 221.

Figure 5A:
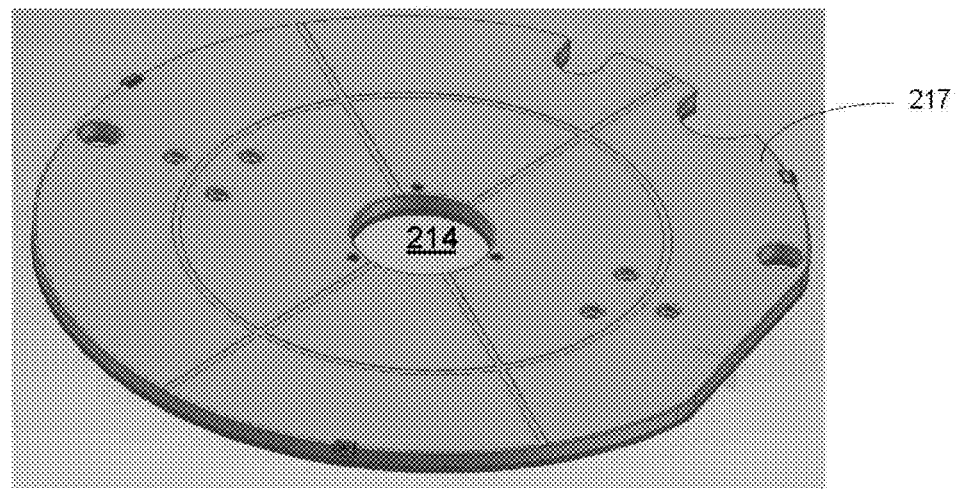
FIGS. 5A-5C illustrate an upper portion and a lower portion of a housing of the first module element according to various embodiments of the invention.
Figure 5B:
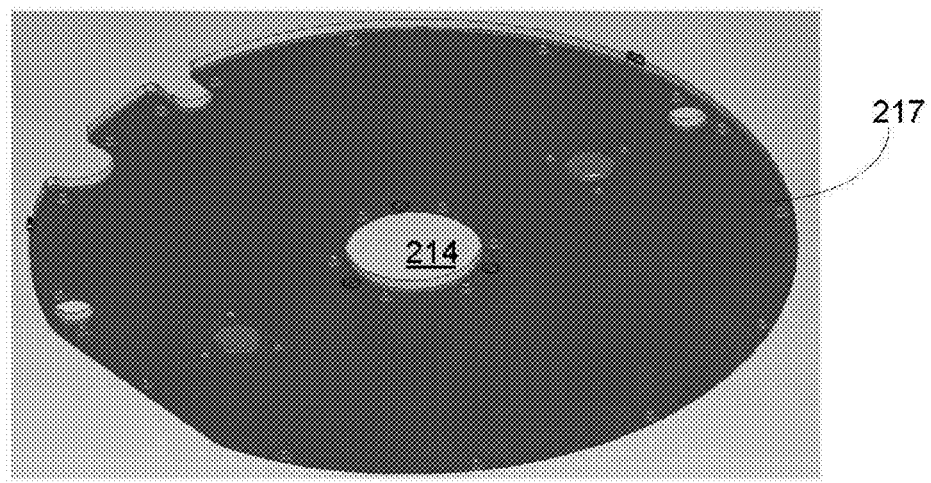
Figure 5C:
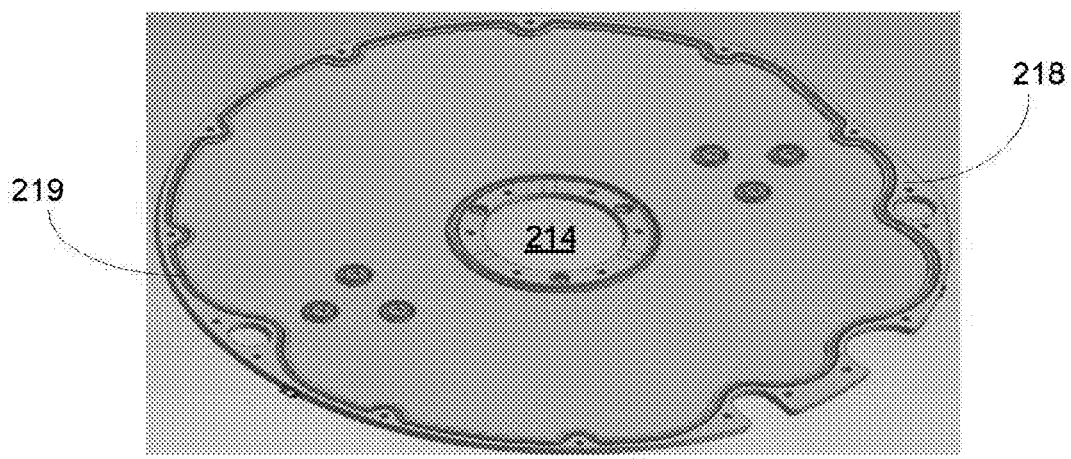

FIGS. 5A-5C illustrate an upper portion 217 and a lower portion 218 of a housing of the first heating module 210 according to various embodiments of the invention. FIG. 5A is a top view of the upper portion 217. FIG. 5B is a bottom view of the lower portion 218. FIG. 5C is a bottom view of an internal surface of the upper portion 217. It also illustrates a sealing band 219 that can assist in sealing the housing when the upper and lower portions are fastened against each other. The upper and lower portions of these figures are illustrated as having a central aperture 214, other smaller apertures, "mouse bites" and cut edge and have a shape and size that fits the semiconductor wafer so that except for the aperture 214 and some other small areas all parts of the semiconductor wafer are heated by first heating module 210.

According to yet another embodiment of the invention, the temperature of the semiconductor wafer is set to a desired temperature (that may be equal to the second temperature, or higher than the second temperature) by a device that differs from the first chamber. The first chamber can have a less significant part in the temperature control of the semiconductor than in the previously illustrated embodiment and can either not affect the temperature at all, merely maintain the temperature of the semiconductor wafer and the like. In this case one or more heating elements of the first chamber (if such exist) may not contact the semiconductor wafer. The device can be a heating device, a cooling device, can be included in a cassette that conveys semiconductor wafers or differ from such a cassette.

According to an embodiment of the invention a method may be provided and may include heating the semiconductor wafer to a second temperature by a device that differs from the first chamber, receiving the semiconductor wafer at the first chamber when the first chamber is at a first pressure level and the semiconductor wafer is at a second temperature; reducing the pressure level of the first chamber to a second pressure level; and providing the semiconductor wafer to a supporting element of a second chamber when the second chamber maintains a third pressure level; wherein the supporting element is at a third temperature; wherein the third temperature is closer to the second temperature than to the first temperature; and wherein the third pressure level is closer to the second pressure level then to the first pressure level.

The method may include slightly modifying the temperature of the semiconductor device by the first chamber.

According to this embodiment a system may be provided. The system may or may not include the device that sets the temperature of the wafer to a second temperature. The system may include (a) a first chamber arranged to receive a semiconductor wafer when the first chamber is at a first pressure level and the semiconductor wafer is at the second temperature; wherein the first chamber is arranged to reduce the pressure level of the first chamber to a second pressure level; (b) a second chamber arranged to receive the semiconductor wafer and place the semiconductor wafer on a supporting element while maintaining a third pressure level; wherein the supporting element is at a third temperature. The third temperature is closer to the second temperature than to the first temperature and the third pressure level is closer to the second pressure level then to the first pressure level.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method, comprising:
   receiving a semiconductor wafer at a first chamber when the first chamber is at a first pressure level and the semiconductor wafer is at a first temperature;
   sensing a temperature of the semiconductor wafer, a wafer cassette or an ambient temperature with at least one temperature sensor;
   heating the semiconductor wafer, by one of a first or a second heating module, to a second temperature and reducing the pressure level of the first chamber to a second pressure level; and
   providing the semiconductor wafer to a supporting element of a second chamber, wherein the second chamber maintains a third pressure level that is closer to the second pressure level than to the first pressure level and the supporting element is at a third temperature that is closer to the second temperature than to the first temperature;
   wherein the first heating module has a central aperture that surrounds a pre-aligner configured to align the wafer to a desired location and/or orientation while in the first chamber; and
   wherein a heating controller is coupled to the first and second heating modules and the at least one temperature sensor, wherein the heating controller receives temperature readings of the at least one temperature sensor, determines a temperature difference between the temperature readings and a second, predetermined temperature, and activates the first heating module if the temperature difference is less than a predetermined value and alternatively activates the second heating module if the temperature difference is greater than the predetermined value.

2. The method according to claim 1 wherein the second and third temperatures are substantially equal to each other, the second and third pressure levels are substantially equal to each other, the first chamber is a load lock, and the second pressure level is a vacuum pressure level.

3. The method according to claim 1, wherein heating the semiconductor wafer by the first heating module comprises contacting a backside of the semiconductor wafer by the first heating module and heating the semiconductor wafer by the first heating module while contacting the semiconductor wafer.

4. The method according to claim 1, wherein heating the semiconductor wafer by the second heating module comprises heating an upper side of the semiconductor wafer by the second heating module.

5. A system comprising:
   a first chamber arranged to receive from a first transfer unit a semiconductor wafer when the first chamber is at a first pressure level and the semiconductor wafer is at a first temperature, the first chamber including a first pressure control unit that is arranged to reduce a pressure level of the first chamber to a second pressure level;
   a first heating module that includes at least one heating element that is controlled by a heating controller that is supplied with temperature readings of at least one temperature sensor;
   the at least one heating element being arranged to heat the semiconductor wafer to a second temperature;
   a second heating module controlled by the heating controller and arranged to heat an upper side of the semiconductor wafer; and
   a second transfer unit arranged to transfer the semiconductor wafer between the first chamber and a second chamber of the system, the second chamber comprising a first supporting element that is arranged to receive the semiconductor wafer while a second pressure control unit maintains a third pressure level that is closer to the second pressure level than to the first pressure level and while the first supporting element is at a third temperature that is closer to the second temperature than to the first temperature;
   wherein the first heating module has a central aperture that surrounds a pre-aligner configured to align the wafer to a desired location and/or orientation while in the first chamber; and wherein the heating controller is coupled to the first and second heating modules and the at least one temperature sensor, wherein the heating controller receives temperature readings of the at least one temperature sensor, determines a temperature difference between the temperature readings and a second, predetermined temperature, and activates the first heating module if the temperature difference is less than a predetermined value and alternatively activates the second heating module if the temperature difference is greater than the predetermined value.

6. The system according to claim 5, wherein the second and third temperatures are substantially equal to each other, the second and third pressure levels are substantially equal to each other, the first chamber is a load lock, and the second pressure level is a vacuum pressure level.

7. The system according to claim 5, wherein the first heating module is arranged to contact a backside of the semiconductor wafer and heat the semiconductor wafer while contacting the semiconductor wafer.

8. The system according to claim 5, wherein the second heating module is arranged to heat the upper side of the semiconductor wafer without contacting the semiconductor wafer.

9. The system according to claim 5, further comprising a lifting module arranged to lift the first heating module and the semiconductor wafer from another element of the first chamber.

10. The system according of claim 5, wherein the first heating module is arranged to start heating the semiconductor wafer before the first pressure control unit starts to reduce the pressure level of the first chamber.

11. The system according to claim 5, wherein the first heating module comprises a heating element that is positioned within a heat conducting housing and is maintained at a pressure level that exceeds the second pressure level.

12. The system according to claim 5, wherein the at least one temperature sensor reads a temperature of the first supporting element of the second chamber.

13. The system according to claim 5, wherein the first heating module comprises a housing that includes a upper portion and a lower portion that define an inner space in which at least one heating element and a least one temperature sensor are positioned.

14. A system comprising:
a first chamber arranged to receive from a first transfer unit a semiconductor wafer when the first chamber is at a first pressure level and the semiconductor wafer is at a first temperature, the first chamber including:
   a first pressure control unit that is arranged to reduce a pressure level of the first chamber to a second pressure level;
   at least one temperature sensor operatively coupled to sense a temperature of the semiconductor wafer, a wafer cassette or an ambient temperature;
   a first heating element and a second heating element operatively coupled to heat the semiconductor wafer in the first chamber;
   a heating controller coupled to the first and second heating elements and the at least one temperature sensor, wherein the heating controller receives temperature readings of the at least one temperature sensor, determines a temperature difference between the temperature readings and a second, predetermined temperature, and activates a first heating element if the temperature difference is less than a predetermined value and alternatively activates a second heating element if the temperature difference is greater than the predetermined value; and
a second chamber arranged to receive from a second transfer unit the semiconductor wafer.

* * * * *